(12) United States Patent
Ong et al.

(10) Patent No.: US 8,134,074 B2
(45) Date of Patent: Mar. 13, 2012

(54) POWER SUPPLY UNIT/AC POWER CORD COUPLER SECURING DEVICE

(75) Inventors: Brett C. Ong, San Jose, CA (US); Brian Benstead, Wrecclesham (GB); Timothy W. Olesiewicz, Dublin, CA (US)

(73) Assignee: Oracle America, Inc., Redwood City, CA (US)

( * ) Notice: Subject to any disclaimer, the term of this patent is extended or adjusted under 35 U.S.C. 154(b) by 480 days.

(21) Appl. No.: 12/333,921

(22) Filed: Dec. 12, 2008

(65) Prior Publication Data

US 2010/0147554 A1    Jun. 17, 2010

(51) Int. Cl.
    *H01B 7/00* (2006.01)
(52) U.S. Cl. ......................................................... 174/135
(58) Field of Classification Search .................. 174/135; 439/373
    See application file for complete search history.

(56) References Cited

U.S. PATENT DOCUMENTS

| | | | | |
|---|---|---|---|---|
| 2,167,541 | A * | 7/1939 | Young | 191/12 R |
| 2,240,050 | A * | 4/1941 | Nuebling | 439/314 |
| 3,520,988 | A * | 7/1970 | Ballock, Sr. | 174/135 |
| 3,708,778 | A * | 1/1973 | McKeever | 439/470 |
| 3,828,302 | A * | 8/1974 | Cieniawa et al. | 439/357 |
| 3,960,432 | A * | 6/1976 | Wilbur | 439/451 |
| 4,154,495 | A * | 5/1979 | Crewse | 439/35 |
| 5,026,300 | A * | 6/1991 | Varner | 439/371 |
| 5,044,976 | A * | 9/1991 | Thompson | 439/368 |
| 5,221,813 | A * | 6/1993 | Michael et al. | 174/659 |
| 5,348,495 | A * | 9/1994 | Kasden | 439/371 |
| 5,472,355 | A * | 12/1995 | Wittmann | 439/373 |
| 5,547,390 | A * | 8/1996 | Laherty | 439/373 |
| 5,655,924 | A * | 8/1997 | Cross et al. | 439/373 |
| 5,731,546 | A * | 3/1998 | Miles et al. | 174/135 |
| 5,872,336 | A * | 2/1999 | Long | 174/135 |
| 5,898,134 | A * | 4/1999 | Fallin et al. | 174/135 |
| 5,922,997 | A * | 7/1999 | Lecinski | 174/135 |
| 5,949,020 | A * | 9/1999 | Mitchell et al. | 174/40 CC |
| 6,153,827 | A * | 11/2000 | Taranto | 174/481 |
| 6,328,594 | B1 * | 12/2001 | Mullen, Jr. | 439/457 |
| 6,427,953 | B1 * | 8/2002 | Dickens | 248/68.1 |
| 6,443,762 | B1 * | 9/2002 | Lessig, III | 439/528 |
| 6,525,273 | B1 * | 2/2003 | Cunningham | 174/135 |
| 6,767,237 | B1 * | 7/2004 | Shih | 439/371 |
| 6,870,095 | B1 * | 3/2005 | Whitted | 174/481 |
| 7,004,785 | B2 * | 2/2006 | Melton et al. | 439/501 |
| 7,081,004 | B1 * | 7/2006 | Puzio | 439/369 |
| 7,168,576 | B2 * | 1/2007 | Williams | 211/26 |
| 7,195,511 | B1 * | 3/2007 | Ornt et al. | 439/369 |
| 7,241,163 | B1 * | 7/2007 | Cox et al. | 439/445 |
| 7,255,588 | B2 * | 8/2007 | Wilder | 439/373 |
| 7,264,497 | B1 * | 9/2007 | Lewis | 439/373 |
| D587,989 | S * | 3/2009 | Johansson | D8/356 |

(Continued)

FOREIGN PATENT DOCUMENTS

JP        05218665 A  *  8/1993

*Primary Examiner* — Xiaoliang Chen
*Assistant Examiner* — Nathan Milakovich
(74) *Attorney, Agent, or Firm* — Brooks Kushman P.C.

(57) ABSTRACT

A securing device for retaining a power cord in a connected relationship with the power supply includes a substantially planar body having a first end and a second end. The first end is configured to engage the power supply. The second end is configured to engage the power cord. The body is made from a substantially rigid material.

20 Claims, 4 Drawing Sheets

U.S. PATENT DOCUMENTS

| | | | |
|---|---|---|---|
| 7,513,791 B1 * | 4/2009 | Gary | 439/373 |
| 7,559,788 B2 * | 7/2009 | Legg | 439/373 |
| 7,568,935 B1 * | 8/2009 | Gonzalez et al. | 439/345 |
| 7,608,786 B2 * | 10/2009 | Deciry et al. | 174/135 |
| 2003/0209361 A1 * | 11/2003 | Sivertsen | 174/135 |
| 2005/0014413 A1 * | 1/2005 | Kurokawa | 439/373 |
| 2006/0011380 A1 * | 1/2006 | Pierce | 174/135 |
| 2006/0046557 A1 * | 3/2006 | Pulizzi et al. | 439/371 |
| 2009/0101389 A1 * | 4/2009 | Chirumbolo | 174/135 |

* cited by examiner

POWER SUPPLY UNIT/AC POWER CORD COUPLER SECURING DEVICE

BACKGROUND OF THE INVENTION

1. Field of the Invention

Embodiments of the present invention relate to a device for coupling an AC power cord to a power supply to prevent the unintentional disconnection of the power cord from the power supply.

2. Background Art

Servers and other computer-related devices may be powered by a power supply. The power supply has a port to connect to an AC power cord. For example, some power supplies include apertures configured to engage prongs of a plug portion of an AC power cord or a standard electrical cord.

The server may be stored in a cabinet that is configured to receive one or more servers. The cabinet housing the server may include a cable management arm that is configured to receive and retain the AC power cord that is attached to the power supply so that the AC power cord does not dangle loosely where it could interfere with the operation or storage of other servers or similar devices within the cabinet. The cable management arm is configured to slide along rail racks within the cabinet and to extend and fold in an accordion style.

When an AC power cord is connected to a power supply and the power supply is connected to a server and the server is inserted into the cabinet, the cable management arm is pushed back by the advancing server and folds into a folded or retracted state. When the server is removed from the cabinet, the power supply pulls on the plug of the AC power cord which, in turn, pulls on the cable management arm thereby unfolding and extending it.

In some instances, the removal of the server from the cabinet can cause the plug to become disconnected from the power supply which would result in a shut down of the server or other device. Such a shut down of a server may be an unacceptable situation. Embodiments of the invention disclosed herein address this and other problems.

SUMMARY OF THE INVENTION

Several embodiments of a securing device for retaining a power cord in a connected relationship with a power supply are disclosed herein. In a first embodiment, the securing device comprises a substantially planar body having a first end and a second end. The first end is configured to engage the power supply and the second end is configured to engage the power cord. The body comprises a substantially rigid material. In this first embodiment, the securing device does not provide an electrical connection between the power cord and the power supply.

In an implementation of the first embodiment, the first end comprises a first hook. In a variation of this implementation, the first hook comprises a planar projection that is integral with the first end. The planar projection projects longitudinally from the first end. The planar projection is curved around the lateral axis of the planar projection. In another variation, the first hook is configured to provide a snap-fit connection to the power supply.

In another implementation of the first embodiment, the second end comprises a second hook. In a variation of this implementation, the second hook is configured to provide a snap-fit connection to the power cord. In another variation of this implementation, the first end also comprises a hook. In still another variation of this implementation, the second hook comprises a curved member configured to form a central aperture. The central aperture is configured to receive the power cord. The central aperture is dimensioned to obstruct a plug that is attached at an end of the power cord from passing through the central aperture. In a further variation, the body may be configured such that the second hook is disposed adjacent the plug when the body is connected to both the power cord and the power supply.

In another implementation of the first embodiment, the first end may comprise a pair of first hooks. The pair of first hooks may be spaced apart from one another along the first end. In a further variation, the second end comprises a pair of second hooks. The pair of second hooks are spaced apart from one another along the second end. In a further variation, the pair of first hooks are substantially coplanar with the pair of second hooks. In a further variation, the pair of first hooks are substantially transverse to the pair of second hooks.

In another implementation of the first embodiment, the body defines a first aperture extending therethrough. The first aperture is disposed proximate the first end.

In another implementation of the first embodiment, the body may define a second aperture extending therethrough. The second aperture may be disposed proximate the second end.

In another implementation of the first embodiment, the first end may comprise a means for engaging the power supply and the second end may comprise a means for engaging the power cord.

In a second embodiment, the securing device comprises a substantially planar body having a first end and a second end. The second end is oriented substantially transversely to the first end. The first end is configured to engage the power supply. The second end is configured to engage the power cord. The body comprises a substantially rigid material.

In an implementation of the second embodiment, the first end comprises a pair of first hooks that are configured to removably attach the first end to the power supply. The second end may comprise a pair of second hooks that are configured to removably attach the second end to the power cord. In a variation of this implementation, the body may define a first aperture extending therethrough. The first aperture may be disposed proximate the first end. The body may also define a second aperture extending therethrough. The second aperture may be disposed proximate the second end.

In a third embodiment, the securing device comprises a substantially planar body having an L-shaped configuration. The body has a first end and a second end. The second end is oriented substantially transversely to the first end. The first end has a pair of integral first hooks. Each of the first hooks are spaced apart from one another along the first end. The pair of first hooks are configured to engage a handle that is attached to the power supply. The second end has a pair of integral second hooks. Each second hook is spaced apart from one another along the second end. The pair of second hooks are configured to engage the power cord. One of the second hooks has a central aperture that is dimensioned to obstruct a plug attached at an end of the power cord from passing through the central aperture. The body defines a first aperture extending therethrough. The first aperture is disposed proximate the first end. The body further defines a second aperture extending therethrough. The second aperture is disposed proximate the second end. The body comprises a substantially rigid material.

BRIEF DESCRIPTION OF THE DRAWINGS

The description herein makes reference to the accompanying drawings wherein like reference numerals refer to like parts throughout the several views, and in which.

DETAILED DESCRIPTION OF THE PREFERRED EMBODIMENT(S)

Detailed embodiments of the present invention are disclosed herein; however, it is to be understood that the disclosed embodiments are merely exemplary of the invention that may be embodied in various and alternative forms. The figures are not necessarily drawn to scale, some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the present invention.

Figure 1:
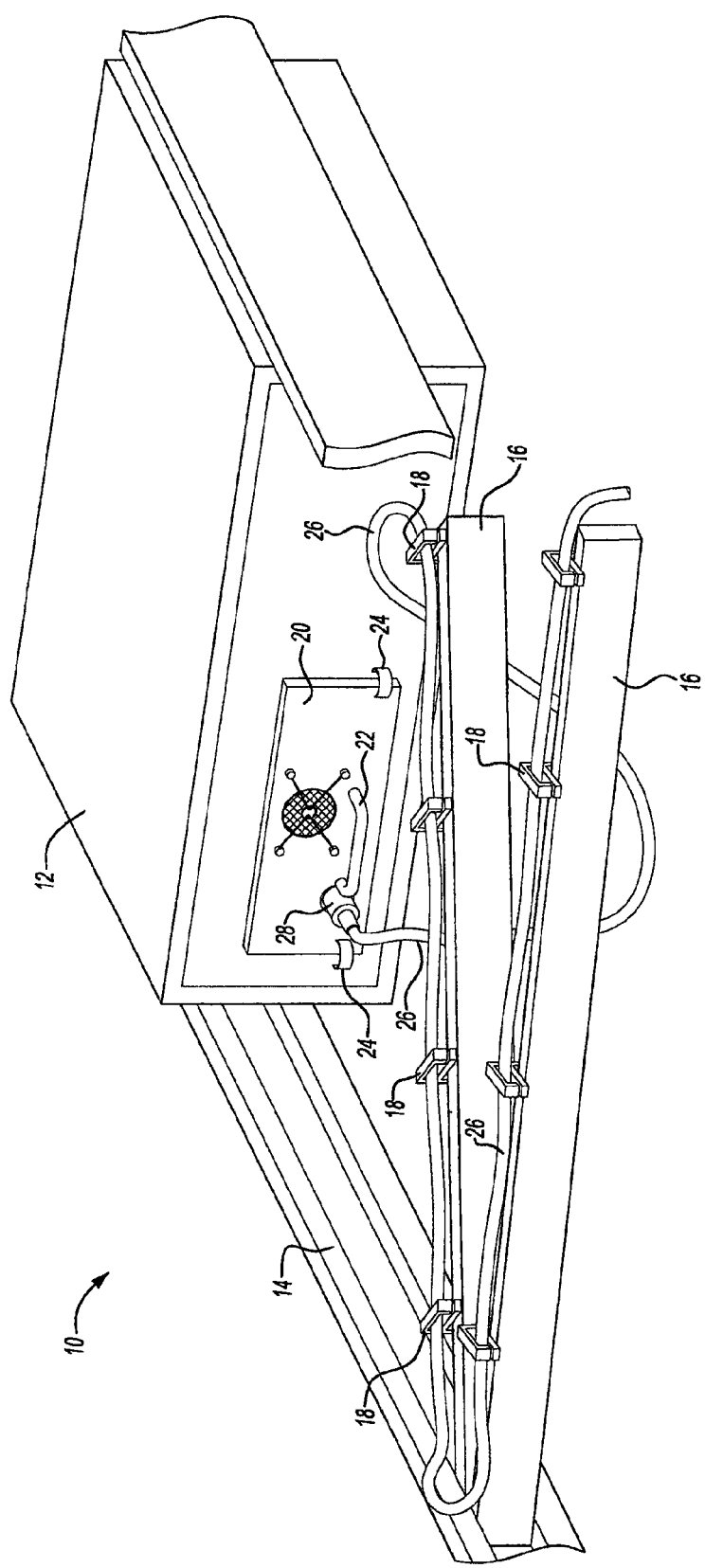
FIG. 1 is a perspective view illustrating a cabinet configured to accommodate a server and a cable management arm configured to receive an AC power cord and to extend as the server is removed from the cabinet.

With respect to FIG. 1, a conventional cabinet 10 that is configured to receiver servers such as server 12 is illustrated. Cabinet 10 includes rack rails 14 to permit server 12 to be slidably secured within cabinet 10. Some cabinets may include a plurality of rack rails to permit the storage of a plurality of servers disposed in a stacked manner, each one being individually slidable into and out of its stored position. Cabinet 10 further includes a cable management arm 16 including a plurality of clips 18 configured to retain a cable such as an AC power cord. Cable management arm 16 is hinged at its center. An end of cable management arm 16 is configured to slide along rack rail 14. Configured in this manner, cable management arm 16 can extend and retract in the direction of movement of server 12 along rack rail 14. In this manner, cable management arm 16 can control a wire or cord secured in clips 18 to prevent such a cord from dangling and possibly tangling with other cords or equipment.

Server 12 is powered by a power supply 20 which, as illustrated in FIG. 1, is disposed in a lower lefthand corner of a back portion of server 12. Power supply 20 includes a handle 22 to permit a person to grip power supply 20 when installing or removing power supply 20 from server 12. Retaining clips 24 serve to retain power supply 20 in a connected position with respect to server 12. To remove power supply 20 from server 12, a person must first release retaining clips 24 and then pull on handle 22 to remove power supply 20 from server 12.

An AC power cord 26 is connected to power supply 20 and is configured to supply power supply 20 with AC power. AC power cord 26 includes a plug 28 to connect to power supply 20. As illustrated, AC power cord 26 is long enough to permit server 12 to be slid along rack rails 14 as server 12 is removed without becoming disconnected from power supply 20. AC power cord 26 is threaded through clips 18 on cable management arm 16.

AC power cord 26 is plugged in or connected to power supply 20 in a manner similar to the way in which conventional AC power cords are plugged into household electrical outlets. AC power cord 26 is held in place in a connected state with power supply 20 by the friction between prongs of plug 28 and apertures in power supply 20 configured to receive the prongs. If enough force is applied to AC power cord 26, plug 28 can become disconnected from power supply 20.

Figure 2:
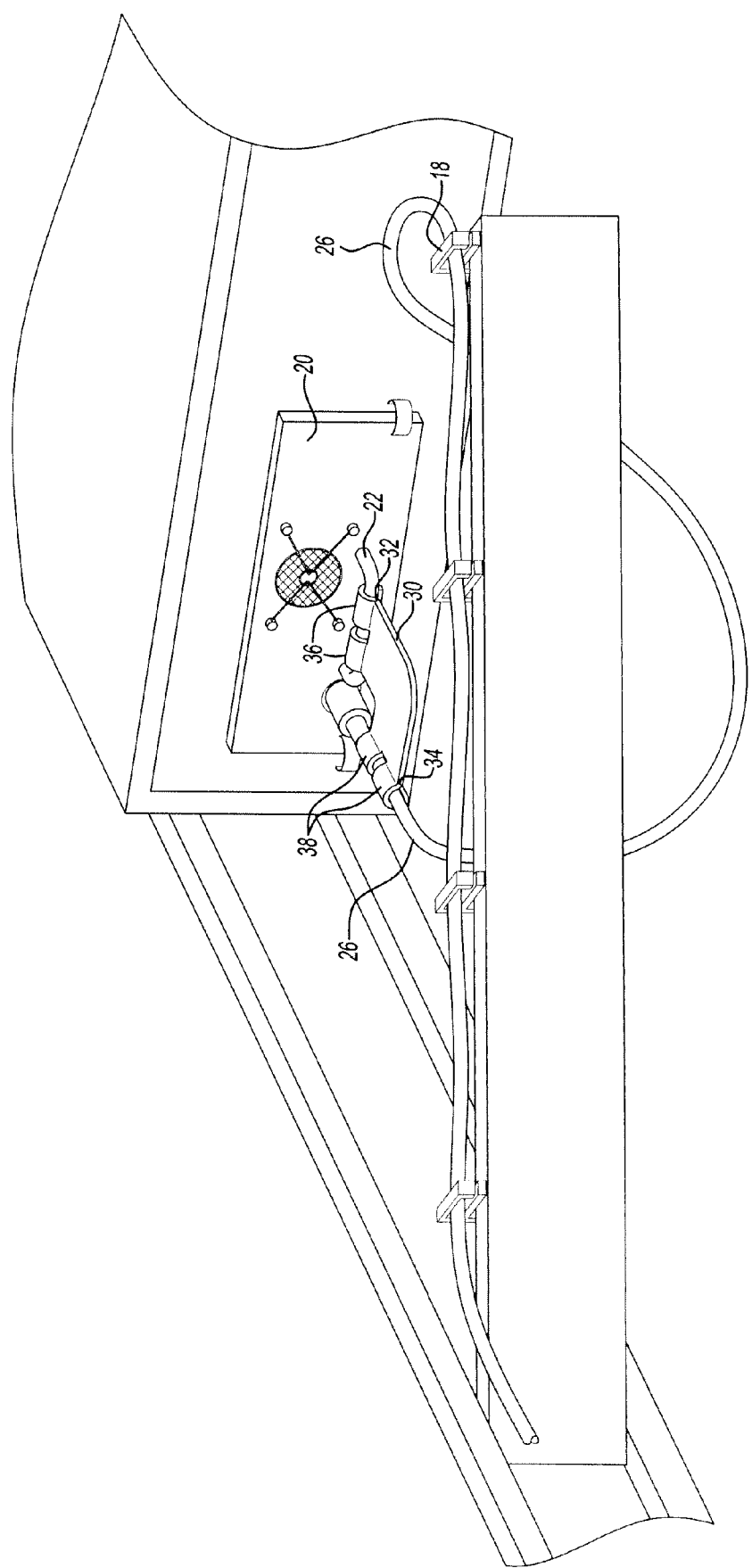
FIG. 2 is a perspective view illustrating the cabinet and server of FIG. 1 with a securing device made in accordance with the teachings of the present invention securing the AC power cord in a connected relationship with the power supply.

With respect to FIG. 2, a securing device 30 has been attached at a first end 32 to handle 22 and at a second end 34 to AC power cord 26. In the illustrated embodiment, securing device 30 is an L-shaped member having a pair of first hooks 36 at first end 32 and a pair of second hooks 38 at second end 34. The pair of first hooks 36 are configured to engage handle 22 in a snap-fit relationship. Similarly, second hooks 38 are also configured to engage AC power cord 26 in a snap-fit relationship. In other embodiments, securing device 30 may have other means for securing to handle 22 and AC power cord 26 including handcuff-type mechanisms, pincher-type mechanisms that are biased towards a closed position, and a plurality of apertures near the respective first and second ends 32, 34 to permit securing device 30 to be tied to handle 22 and AC power cord 26.

Securing device 30 is a substantially rigid, planar body that is resilient to bending forces. In some embodiments, securing device 30 may be made of materials comprising plastic.

Figure 3:
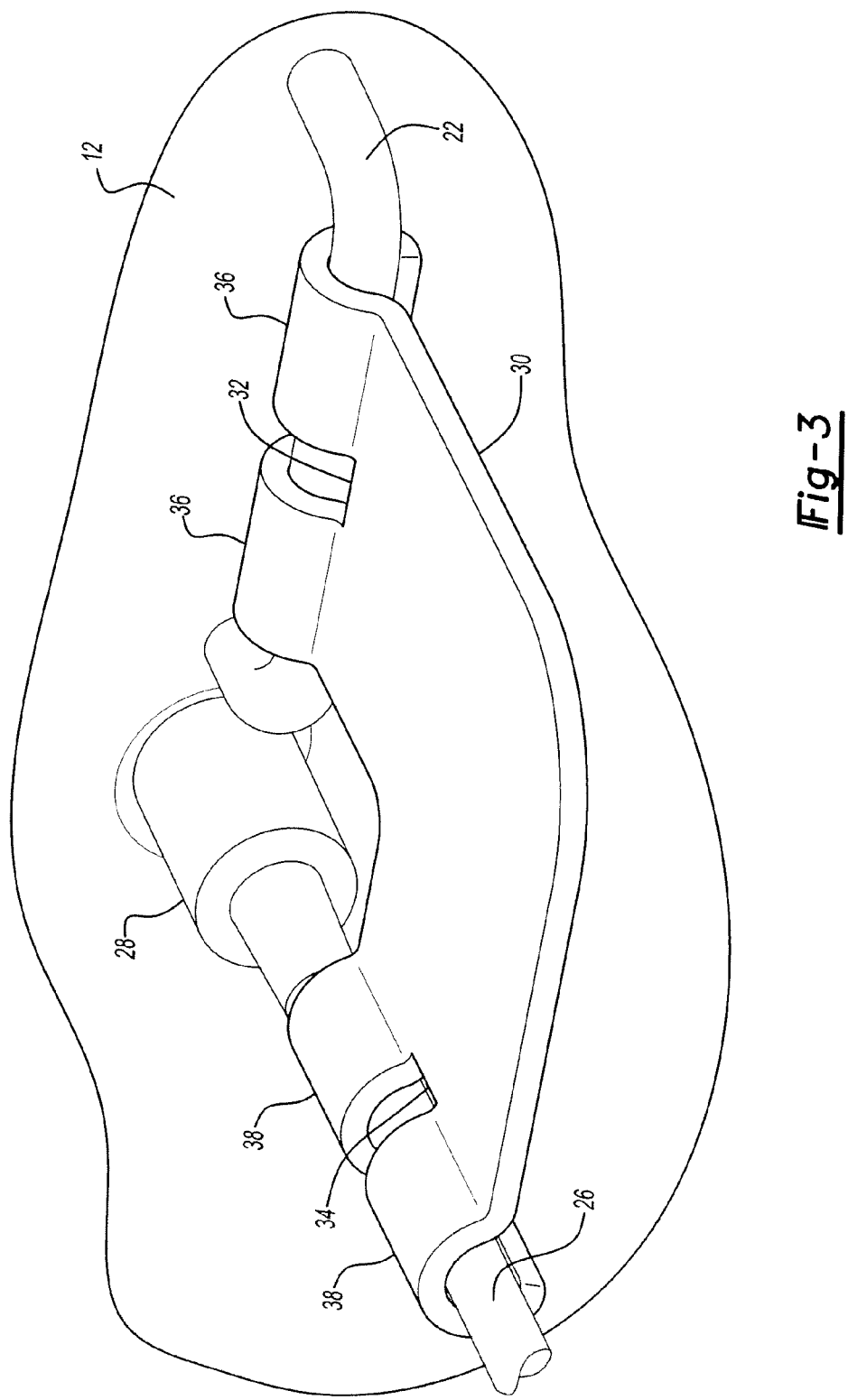
FIG. 3 is a perspective view illustrating the connection between the securing device, the power supply and the AC power cord.

With respect to FIG. 3, an expanded perspective view is presented illustrating securing device 30 attached to handle 22 at first end 32 and to AC power cord 26 at second end 34. As server 12 is pulled out of cabinet 10, cable management arm 16 extends towards the front of cabinet 10. Cable management arm 16 is pulled towards an extended position by plug 28 and power supply 20 as server 12 is removed from cabinet 10. For any of a number of reasons, cable management arm 16 may resist being extended. Such resistance would exert a disconnecting force on AC power cord 26 and plug 28 in a direction opposite to the direction in which server 12 is being pulled out of cabinet 10. If the force acting on AC power cord 26 by cable management arm 16 is sufficiently high, it will exceed the frictional forces acting on the prongs of plug 28, thereby causing plug 28 and AC power cord 26 to become disconnected from power supply 20.

Securing device 30 is configured to counteract the disconnecting force by transferring the disconnecting force from plug 28 to handle 22. Securing device 30 is configured such that one of the second hooks 38 is disposed adjacent to plug 28. As the disconnecting force exerted by cable management arm 16 builds to a state that would otherwise disconnect plug 28, plug 28 begins to move outwardly from power supply 20. As plug 28 moves outwardly, it encounters the second hook 38 which obstructs continued outward movement of plug 28 from power supply 20. Plug 28 applies an outwardly directed force onto the second hook 38. The pair of first hooks 36 secured to handle 22 prevent the movement of securing device 30 in an outward direction from power supply 20. Because securing device 30 is a substantially rigid body that does not substantially bend or stretch in response to the disconnecting force, the second hook 38 holds firm against plug 28 and prevents plug 28 from becoming disconnected from power supply 20. As the force exerted by a person removing server 12 from cabinet 10 increases, securing device 30 pulls with increasing force on AC power cord 26 and may eventually exceed the force needed to dislodge cable management arm 16 from its retracted position. In other embodiments, rather than obstructing plug 28 with second hook 38, the pair of second hooks 38 may, through a snap-fit relationship with AC power cord 26, pull directly on AC power cord 26. If a user wishes to use AC power cord 26 to disconnect plug 28 from power supply 20, he may still do so by disconnecting either first end 32 from handle 22 or second end 34 from AC power cord 26.

Figure 4:
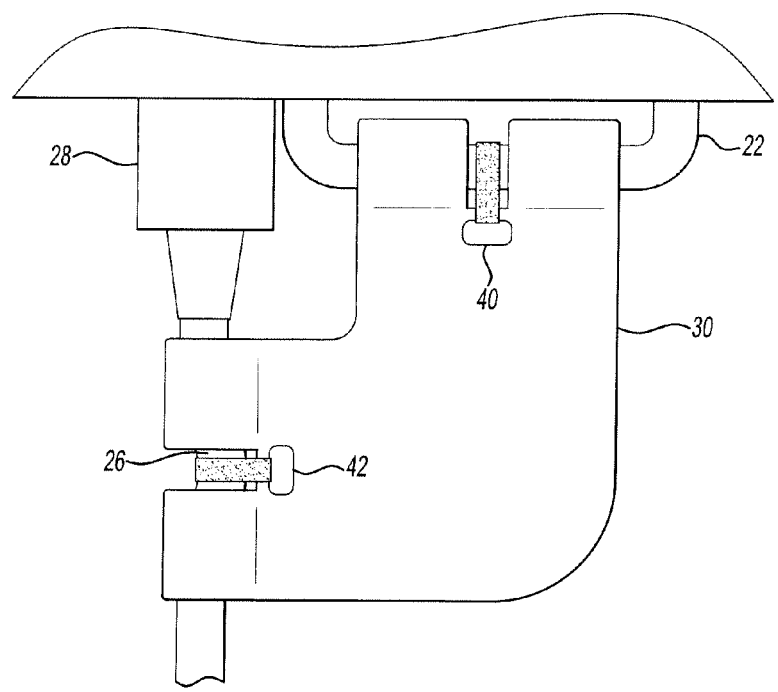
FIG. 4 is a plan view illustrating an alternate embodiment of the securing device of FIG. 2.

With respect to FIG. 4, a plan view of an alternate embodiment of securing device 30 is illustrated. In this embodiment, securing device 30 defines a first aperture 40 extending through securing device 30 as well as a second aperture 42 also extending through securing device 30. First and second apertures provide a passageway to permit tethers, cord, string, tie straps or other securing devices to be used to tie handle 22 and AC power cord 26 to securing device 30. In other embodiments, a plurality of first and second apertures 40, 42 may be defined through securing device 30.

Figure 5:
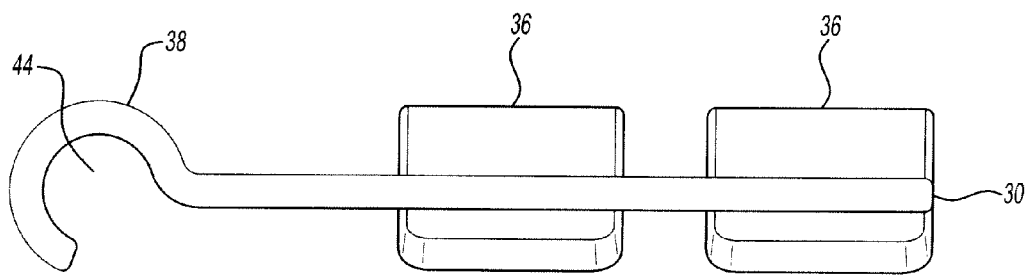
FIG. 5 is a side view illustrating the securing device of FIG. 2.

With respect to FIG. 5, a side view of securing device 30 is illustrated. In this view, it can be seen that securing device 30 comprises a substantially planar body and that pair of first hooks 36 and pair of second hooks 38 fall within substantially the same plane. Second hook 38 comprises a planar member that is curved to form a central aperture 44 to receive AC power cord 26. A pair of first hooks 36 similarly include a central aperture 44 (not shown) to receive handle 22.

It should be understood by those of ordinary skill in the art that although securing device 30 has been illustrated as having an L-shaped body, other configurations are acceptable. For instance, securing device 30 may be configured to have the shape of a truncated triangle with pair of first hooks 36 and pair of second hooks 38 disposed substantially transversely to one another. Securing device 30 may be made of plastic or any other suitable material. If securing device 30 is made of plastic, it may be injection molded, gas-assist injection molded, molded with foam or by any other suitable means. In still other embodiments, securing device 30 may be machined from a solid block of plastic or other material. In still other embodiments, first hooks 36 and second hooks 38 may be separately fabricated and attached to first and second ends 32, 34 through the use of mechanical fasteners, the use of adhesives, welding or by any other means effective to secure first and second hooks 36, 38 to first and second ends 32, 34, respectively. One of the many advantages of the embodiments described herein is that by configuring the first and the second ends 32, 34 to engage the power supply, and in particular, the handle 22 of power supply 20 is that there is no need for additional attachment mechanisms to be mounted on the power supply 20 itself. This eliminates any impact to the available space for openings on the rear of power supply 20. This, in turn, does not adversely impact thermal performance of power supply 20. Additionally, the streamlined design of securing device 30 either does not impede airflow or only minimally impedes airflow to power supply 20 and hence, has no or only minimal impact on thermal performance of power supply 20. Similarly, disposing the first and second hooks 36, 38 in the same plane also minimizes impact on airflow past securing device 30.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A securing device for retaining a power cord in a connected relationship with a power supply, the securing device comprising:
    a substantially planar body having a first end and a second end, the body comprising a substantially rigid material;
    a first securing member provided at the first end and being configured to engage the power supply, the first securing member defining an aperture for receiving a portion of the power supply, the aperture extending along an axis that is generally coplanar with the body; and
    a second securing member provided at the second end and being configured to engage the power cord, the second securing member comprising a second hook configured to provide a snap-fit connection to the power cord;
    wherein the securing device does not provide an electrical connection between the power cord and the power supply.

2. The securing device of claim 1 wherein the first securing member comprises a first hook.

3. The securing device of claim 2 wherein the first hook comprises a projection integral with the first end, the projection being curved around the axis.

4. The securing device of claim 2 wherein the first hook is configured to provide a snap-fit connection to the power supply.

5. A securing device for retaining a power cord in a connected relationship with a power supply, the securing device comprising:
    a substantially planar body having a first end and a second end, the body comprising a substantially rigid material;
    a first securing member provided at the first end and being configured to engage the power supply, the first securing member defining an aperture for receiving a portion of the power supply, the aperture extending along an axis that is generally coplanar with the body; and
    a second securing member provided at the second end and being configured to engage the power cord, the second securing member comprising a second hook, the second hook comprising a curved member configured to form a central aperture that extends along an axis that is generally coplanar with the body, the central aperture being configured to receive the power cord, and the central aperture being dimensioned to obstruct a plug attached at an end of the power cord from passing through the central aperture;
    wherein the securing device does not provide an electrical connection between the power cord and the power supply.

6. The securing device of claim 5 wherein the second hook is configured to provide a snap-fit connection to the power cord.

7. The securing device of claim 5 wherein the first securing member comprises a first hook.

8. The securing device of claim 5 wherein the body is configured such that the second hook is disposed adjacent the plug when the body is connected to both the power cord and the power supply.

9. The securing device of claim 2 further comprising an additional first hook at the first end, the additional first hook being spaced apart from the first hook and defining an additional aperture that extends along the axis.

10. The securing device of claim 9 further comprising an additional second hook at the second end, the additional second hook being spaced apart from the second hook.

11. The securing device of claim 10 wherein the first hooks are substantially coplanar with the second hooks.

12. The securing device of claim 11 wherein the first hooks are substantially transverse to the second hooks.

13. The securing device of claim 1 wherein the body defines a first aperture extending therethrough for receiving an additional securing device for securing the securing device to the power supply, the first aperture being disposed proximate the first end and spaced away from the first securing member.

14. The securing device of claim 1 wherein the body defines a second aperture extending therethrough, the second aperture being disposed proximate the second end.

15. A securing device for retaining a power cord in a connected relationship with a power supply, the securing device comprising:
- a body having an L-shaped configuration, a first end and a second end, the second end being oriented substantially transversely to the first end, the first end being configured to engage the power supply, the second end being configured to engage the power cord, and the body comprising a substantially rigid material;
- wherein the first end comprises a pair of first hooks configured to removably attach the first end to the power supply, and the second end comprises a pair of second hooks configured to removably attach the second end to the power cord, and wherein the first hooks extend along a first axis and the second hooks extend along a second axis that is generally transverse to the first axis and generally coplanar with the first axis.

16. The securing device of claim 15 wherein the body defines a first aperture extending therethrough for receiving a first additional securing device, the first aperture being disposed proximate the first end and spaced away from the first hooks, and wherein the body defines a second aperture extending therethrough for receiving a second additional securing device, the second aperture being disposed proximate the second end and spaced away from the second hooks.

17. A securing device for retaining a power cord in a connected relationship with a power supply, the securing device comprising:
- a substantially planar body having an L shaped configuration, the body having a first end and a second end, the second end being oriented substantially transversely to the first end, the first end having a pair of integral first hooks, each first hook being spaced apart from one another along the first end, the pair of first hooks being configured to engage a handle attached to the power supply, the second end having a pair of integral second hooks, each second hook being spaced apart from one another along the second end, the pair of second hooks being configured to engage the power cord, one of the second hooks having a central aperture dimensioned to obstruct a plug attached at an end of the power cord from passing through the central aperture, the body defining a first aperture extending therethrough, the first aperture being disposed proximate the first end, the body further defining a second aperture extending therethrough, the second aperture being disposed proximate the second end, and the body comprising a substantially rigid material.

18. The securing device of claim 1 wherein the body has an L-shaped configuration.

19. A securing device for retaining a power cord in a connected relationship with a power supply, the securing device comprising:
- a substantially planar body having a first end and a second end, the body comprising a substantially rigid material;
- a first securing member provided at the first end and being configured to engage the power supply, the first securing member comprising a first hook and defining an aperture for receiving a portion of the power supply, the aperture extending along an axis that is generally coplanar with the body;
- a second securing member provided at the second end and being configured to engage the power cord, the second securing member comprising a second hook;
- an additional first hook at the first end, the additional first hook being spaced apart from the first hook and defining an additional aperture that extends along the axis; and
- an additional second hook at the second end, the additional second hook being spaced apart from the second hook;
- wherein the securing device does not provide an electrical connection between the power cord and the power supply.

20. The securing device of claim 19 wherein the pair of first hooks are configured to removably attach the first end to the power supply, and the pair of second hooks are configured to removably attach the second end to the power cord, and wherein the first hooks extend along a first axis and the second hooks extend along a second axis that is generally transverse to the first axis and generally coplanar with the first axis.

* * * * *